(12) United States Patent
Asada

(10) Patent No.: US 6,880,213 B1
(45) Date of Patent: Apr. 19, 2005

(54) METHOD FOR SCREENING PIEZOELECTRIC TRANSFORMER APPARATUS

(75) Inventor: Takaaki Asada, Moriyama (JP)

(73) Assignee: Murata Manufacturing Co., LTD, Kyoto (JP)

( * ) Notice: Subject to any disclaimer, the term of this patent is extended or adjusted under 35 U.S.C. 154(b) by 0 days.

(21) Appl. No.: 09/421,434

(22) Filed: Oct. 19, 1999

(30) Foreign Application Priority Data

Oct. 20, 1998 (JP) .......................................... 10-298902

(51) Int. Cl.⁷ .......................... H04R 17/00; G01R 29/22
(52) U.S. Cl. .......................... 29/25.35; 29/594; 29/593; 324/727; 73/1.82; 310/338; 310/319
(58) Field of Search .............................. 29/25.35, 593, 29/594; 324/727, 537; 73/1.82; 310/338, 319

(56) References Cited

U.S. PATENT DOCUMENTS

| | | | | |
|---|---|---|---|---|
| 3,610,969 A | * | 10/1971 | Clawson et al. | 29/25.35 |
| 4,099,407 A | * | 7/1978 | Louit | 73/1.82 |
| 4,190,937 A | * | 3/1980 | Massa | 29/25.35 |
| 4,412,172 A | * | 10/1983 | Vig | 29/25.35 |
| 4,496,900 A | * | 1/1985 | Di Stefano et al. | 29/593 |
| 5,004,985 A | * | 4/1991 | Holroyd et al. | 324/727 |
| 5,295,487 A | * | 3/1994 | Saitoh et al. | 310/334 |
| 5,701,645 A | * | 12/1997 | Allen et al. | 29/25.35 |
| 5,758,397 A | * | 6/1998 | Inoi et al. | 29/25.35 |
| 5,764,068 A | * | 6/1998 | Katz et al. | 324/727 |

FOREIGN PATENT DOCUMENTS

| | | | |
|---|---|---|---|
| JP | 48-93287 | 12/1973 | |
| JP | 56-71472 | 6/1981 | |
| JP | 5-206539 | * 8/1993 | 29/25.35 |
| JP | 10-75577 | 3/1998 | |

OTHER PUBLICATIONS

Kawamura et al, Development of a High Voltage Sensor Using a Piezoelectric Transucer and a Strain Gage, Instrumentation and Measurement, IEEE Transactions, pp. 564–568, vol. 37, Dec. 1988.*

Brissaud, Characterization of Piezoceramics, Transactions on Ultrasonics, Ferroelectrics and Frequency Control, pp. 603–617, vol. 38, Nov. 1991.*

* cited by examiner

Primary Examiner—A. Dexter Tugbang
(74) Attorney, Agent, or Firm—Keating & Bennett, LLP

(57) ABSTRACT

A method for quickly screening piezoelectric transformer apparatuses having low mechanical strength and latent defects is performed by connecting a load impedance to a generator of a piezoelectric transformer apparatus and applying a stress signal to an actuator to vibrate the piezoelectric transformer apparatus. Latent-defect transformer apparatuses having low mechanical strength are damaged during this process and therefore can be easily identified.

18 Claims, 4 Drawing Sheets

METHOD FOR SCREENING PIEZOELECTRIC TRANSFORMER APPARATUS

BACKGROUND OF THE INVENTION

1. Field of the Invention

The present invention relates to a method for screening a piezoelectric transformer apparatus used in a liquid crystal display backlight inverter, a fluorescent lamp lighting inverter, a DC-DC converter, an AC adapter and other such apparatuses.

2. Description of the Related Art

Conventional piezoelectric transformer apparatuses include a so-called Rosen-type transformer which has a piezoelectric plate made of a piezoelectric ceramic material. An actuator, which is polarized in the thickness direction, is provided on one half of the piezoelectric plate and a generator, which is polarized in the longitudinal direction, is provided on an end surface of the other half of the piezoelectric plate. A pair of input electrodes is provided on the actuator and an output electrode is provided on the generator. When an alternating voltage is applied across the input electrodes, a strong mechanical vibration is generated in the longitudinal direction. The generator in turn is electrified by a piezoelectric effect, thus generating a boosted output voltage across the output electrode.

The above-described piezoelectric transformer apparatus is used in, for example, a cold-cathode tube lighting circuit for a backlight of a liquid crystal display. In such a case, the cold-cathode tube is connected between the output electrode and a ground.

Generally, an S-N curve, as shown in FIG. 8, is known as an illustration of fatigue failure caused by a repeated stress applied to a solid body. Referring to FIG. 8, the vertical axis represents the magnitude (stress level) of the repeated stress applied to the solid body.

The horizontal axis shows the number of repetitions required for breaking the solid body. In general, the horizontal axis is represented by a logarithmic scale. The S-N curve consists of a sloping part and a flat part. Even if a stress that is not greater than the stress represented by the flat part of the S-N curve is infinitely repeated and applied to the solid body, the solid body will not be damaged. The stress represented by the flat part is referred to as a fatigue limit. The solid body to which the repeated stress is applied is used with a stress below the fatigue limit.

However, there may be some solid bodies having fatigue limits that are below the normal fatigue limit due to differences in manufacturing and materials. FIG. 8 indicates that each of the defective apparatuses has a sloping part extending to a smaller stress level in accordance with the degree of defects. The gradient of the sloping part may vary in accordance with defect conditions. When the stress of actual use is applied to the defective apparatuses, the results will vary in accordance with the degree of defects. Some solid bodies will not be damaged; some solid bodies will be damaged immediately; and some solid bodies will be damaged after a long period of time, e.g. a few days or even a few months.

As described above, the piezoelectric transformer apparatus is used by generating a strong mechanical vibration via an applied electrical signal. Because the piezoelectric transformer apparatuses vary in mechanical strength, some of the transformer apparatuses may be cracked or damaged while being used.

The defect leading to failure is contained within the piezoelectric plate. Thus, identification of a defective apparatus cannot be performed by external observation. Previously, it has been impossible to quickly inspect the strength of the piezoelectric transformer apparatus and identify and eliminate defective apparatuses having latent defects. A long time is required to inspect the strength of the piezoelectric transformer apparatus under conditions in which a load and an input signal during actual use of the transformer are applied. All of the latent defects cannot be eliminated in a short period of time. There has been no acceptable solution for solving this problem and for preventing the defective apparatuses from being used. In actual manufacturing processes, inspection of the strength of the apparatus must be performed within a period of time of just a few seconds which has not been possible in conventional methods.

SUMMARY OF THE INVENTION

To overcome the above described problems, preferred embodiments of the present invention provide a method for quickly screening a piezoelectric transformer apparatus, which has low mechanical strength and a latent defect, during a manufacturing process.

One preferred embodiment of the present invention provides a method for screening a piezoelectric transformer apparatus including one of a single-layer piezoelectric plate and a multilayer piezoelectric plate on which an actuator and a generator are provided. The method is performed by connecting a load impedance to the generator and applying a stress signal to the actuator to vibrate the piezoelectric transformer apparatus, whereby latent-defect apparatuses are readily and easily identified.

Preferably, a vibration level of the piezoelectric transformer apparatus caused by the stress signal is set in the range of the vibration level in actual use to that of a fatigue limit of a normal piezoelectric transformer apparatus.

The value of the load impedance is preferably not less than about ten times an output impedance of the piezoelectric transformer apparatus.

The value of the load impedance is preferably not more than about one tenth of an output impedance of the piezoelectric transformer apparatus.

The load impedance may be a resistance element.

The stress signal may be a sinusoidal continuous wave or may be a sinusoidal burst wave.

A duty ratio of the burst wave is preferably not be more than about 10%.

The piezoelectric transformer apparatus may be cooled during the screening process.

The piezoelectric transformer apparatus may be a Rosen-type piezoelectric transformer apparatus.

The above described method is simply performed by connecting the load impedance to the generator and applying the stress signal to the actuator. Therefore, the method can easily be incorporated into a manufacturing process used for forming the piezoelectric transformer. By varying screening conditions including the vibration level, the value of the load impedance and the stress signal, transformer apparatuses having latent defects and low mechanical strength are quickly and accurately identified.

The vibration level is preferably greater than the vibration level in actual use to significantly shorten the screening time, but the vibration level is preferably smaller than the fatigue limit of normal apparatuses so that normal apparatuses are not damaged.

The load impedance is preferably a resistance element having no frequency dependence. The load impedance is preferably not less than about ten times the output impedance or not more than about one tenth of the output impedance so that a required vibration level is obtained with the stress signal of a lower level.

The stress signal is preferably a sinusoidal wave or a burst wave so as to keep the oscillator circuit simple. Therefore, a temperature increase caused by heat generated by the piezoelectric transformer apparatus is prevented. Preferably, the duty ratio of the burst wave is not more than about 10%.

The piezoelectric transformer apparatus is preferably cooled duing the screening process, thus further preventing the temperature increase.

The piezoelectric transformer apparatus incorporated in the method is preferably a Rosen-type piezoelectric transformer apparatus which has a simple configuration and has low manufacturing cost. The method may also be applied to other types of piezoelectric transformers.

For the purpose illustrating the present invention, there is shown in the drawings several forms and embodiments which are presently preferred, it being understood, however, that the invention is not limited to the precise arrangements and instrumentalities shown.

DETAILED DESCRIPTION OF PREFERRED EMBODIMENTS

The present invention will become clear from the following description of a method for screening a piezoelectric transformer apparatus according to preferred embodiments of the present invention taken in conjunction with the accompanying drawings.

Figure 1:
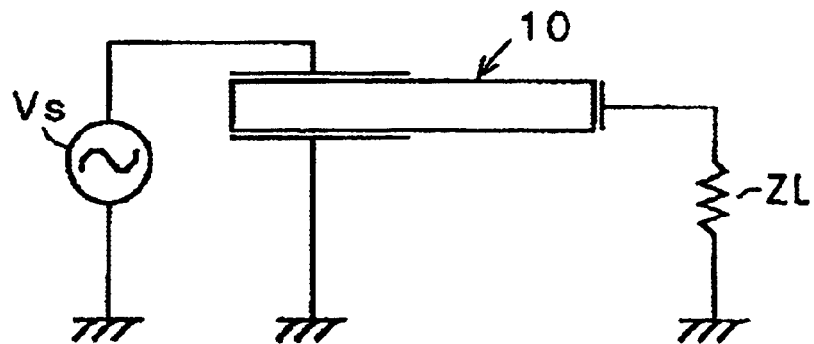
FIG. 1 is a circuit diagram showing a method for screening a piezoelectric transformer apparatus according to preferred embodiments of the present invention.

FIG. 1 is a circuit diagram showing a method for screening a piezoelectric transformer apparatus according to a preferred embodiment of the present invention. Referring to FIG. 1, the method for screening the piezoelectric transformer apparatus is performed by connecting a load impedance ZL to a generator of a piezoelectric transformer apparatus 10 and applying a stress signal Vs to an actuator of the piezoelectric transformer apparatus 10, thus vibrating the piezoelectric transformer apparatus 10. Specifically, in the preferred embodiment, a resistance element is preferably connected as the load impedance ZL between an output electrode of the generator and a ground, and a sinusoidal wave signal is applied as the stress signal Vs across input electrodes of the actuator. The piezoelectric transformer apparatus 10 is vibrated at a predetermined vibration level for a predetermined period, thus damaging piezoelectric transformer apparatuses of low mechanical strength which have latent defects to thereby quickly and easily identify defective transformer apparatuses.

Figure 2A:
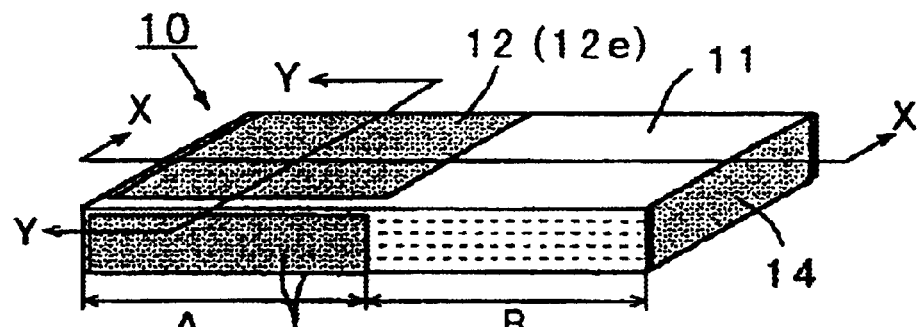
FIG. 2A is a perspective view of a piezoelectric transformer apparatus included in a preferred embodiment of the present invention.
Figure 2B:
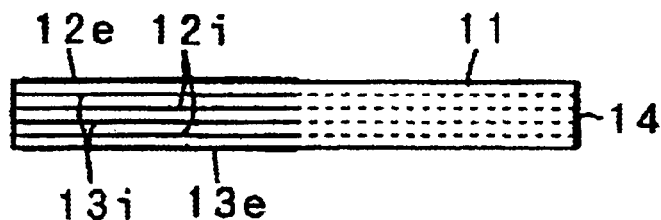
FIG. 2B is a sectional view taken along the line X—X of FIG. 2A.
Figure 2C:
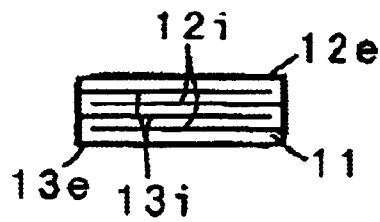
FIG. 2C is a sectional view taken along the line Y—Y of FIG. 2A.

The piezoelectric transformer apparatus 10 may be, for example, a Rosen-type piezoelectric transformer apparatus having a multilayer structure, as shown in FIGS. 2A to 2C. However, other transformer apparatuses may also be used with preferred embodiments of the present invention.

The piezoelectric transformer apparatus 10 preferably includes a piezoelectric plate 11 which may include a substantially rectangular plate in which a plurality of green sheets made of piezoelectric ceramics, e.g. lead zirconate titanate (PZT), are stacked and pressed one on top another, and which in turn are monolithically baked. One half (the left side in FIG. 2A) in the longitudinal direction of the piezoelectric plate 11 is provided with a pair of opposing input electrodes 12 and 13 disposed inside of the stack and extending substantially along the entire upper and lower surfaces. The other half of the piezoelectric plate 11 is provided with an output electrode 14 at the end surface thereof in the longitudinal direction. The input electrodes 12 and 13 preferably include inner electrodes $12i$ and $13i$ disposed between the piezoelectric ceramics layers and exterior electrodes $12e$ and $13e$. Each of the exterior electrodes $12e$ and $13e$ is formed so as to extend over one side of the piezoelectric plate 11 in the width direction. Each of the inner electrodes $12i$ is connected to the exterior electrode $12e$ at a first side thereof, and each of the inner electrodes $13i$ is connected to the exterior electrode $13e$ at an opposite second side thereof. A first portion of the apparatus where the input electrodes 12 and 13 are located is polarized in the thickness direction, thus defining an actuator A. The second portion is polarized in the longitudinal direction, thus defining a generator B. In general, one input electrode 13 is grounded as a common electrode (ground electrode).

In the piezoelectric transformer apparatus 10, an alternating voltage having a frequency which is approximately the same as the natural resonant frequency in the longitudinal direction of the piezoelectric transformer apparatus 10 is applied across the input electrodes 12 and 13, which in turn generates a strong mechanical vibration in the piezoelectric transformer apparatus 10 in the longitudinal direction. The generator B becomes electrified by the piezoelectric effect and a boosted output voltage is generated across the output electrode 14 and the ground electrode 13.

Figure 8:
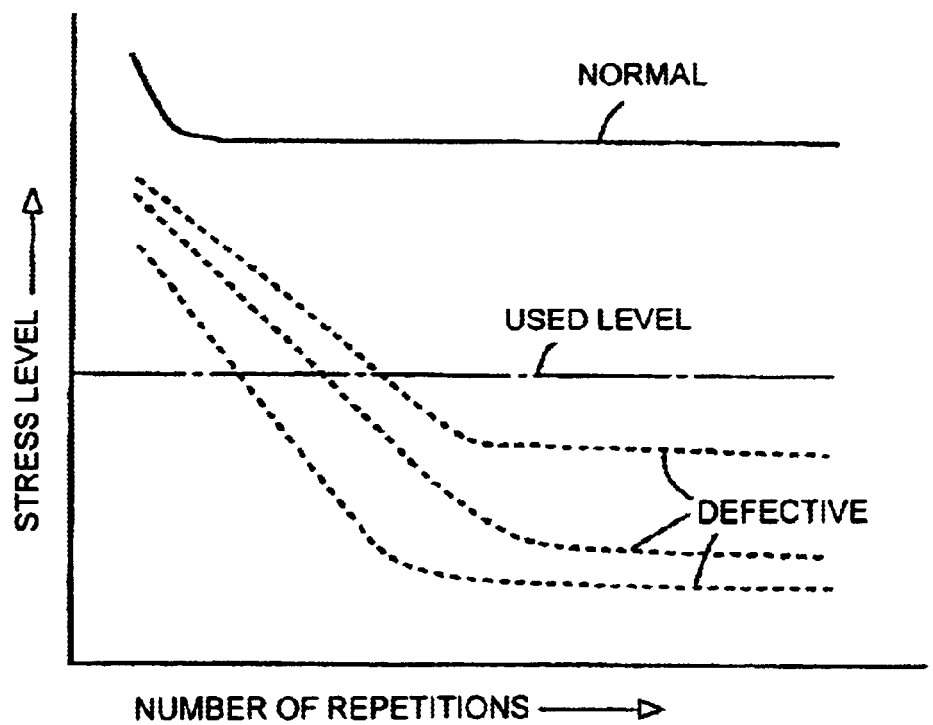
FIG. 8 is a graph showing a relationship between the magnitude of a stress and the number of repetitions of a repeated stress applied to a solid body.

For screening (discriminating and eliminating) a piezoelectric transformer apparatus of low mechanical strength having a latent defect, as illustrated by the S-N curve shown in FIG. 8, it is preferable to set a vibration level of the mechanical vibration driven by the stress signal Vs within the range of the vibration level in actual use according to the vibration level of a normal transformer apparatus, in order to identify and eliminate the transformer apparatuses that are likely to be damaged in actual use. However, when the vibration level is set in the vicinity of the vibration level in actual use, a longer period is required to damage latent-defect apparatuses. When applying the screening method of preferred embodiments of the present invention during manufacturing processes, it is desirable to eliminate latent-defect apparatuses in a much shorter period of time.

In the present preferred embodiment, a manufacturing process is performed by continuous steps of polarizing each piezoelectric transformer apparatus, applying the stress signal to the apparatus (screening), and measuring characteristics of the transformer apparatus. It is thus necessary to perform the screening for defective transformers in a few seconds. Discrimination of the piezoelectric transformer apparatuses damaged by the screening is performed by detecting the voltage or current of the load impedance. Since the screening causes a rupture in the piezoelectric transformer apparatus, the defect may easily be located by visual observation.

Described below are more preferable settings of the screening method when used for a cold-cathode tube lighting circuit. In the screening method, the multilayer Rosen-type piezoelectric transformer apparatus, as shown in FIG. 2, which may have, for example, a length of about 20 mm, a width of about 6 mm, a thickness of about 1.5 mm, 12 stacked layers, and a frequency of about 90 kHz, is preferably used as the piezoelectric transformer apparatus 10.

The vibration level in the screening method is described below. In the fundamental vibration of the Rosen-type piezoelectric transformer apparatus, the position of the maximum vibration velocity is the vibration antinode, i.e., the end surface in the longitudinal direction, and the position of the maximum stress is the vibration node, i.e., the approximately center portion in the longitudinal direction. In this preferred embodiment of the present invention, the maximum vibration velocity is used as the vibration level.

The vibration level of the piezoelectric transformer apparatus in actual use varies in accordance with operating conditions. In this preferred embodiment, the maximum vibration velocity of the piezoelectric transformer apparatus is preferably about 0.3 m/s. It is known that the normal fatigue limit of the PZT piezoelectric material is a stress level of approximately 100 MPa. This stress may be converted to a vibration velocity of about. 3.8 m/s.

Figure 3:
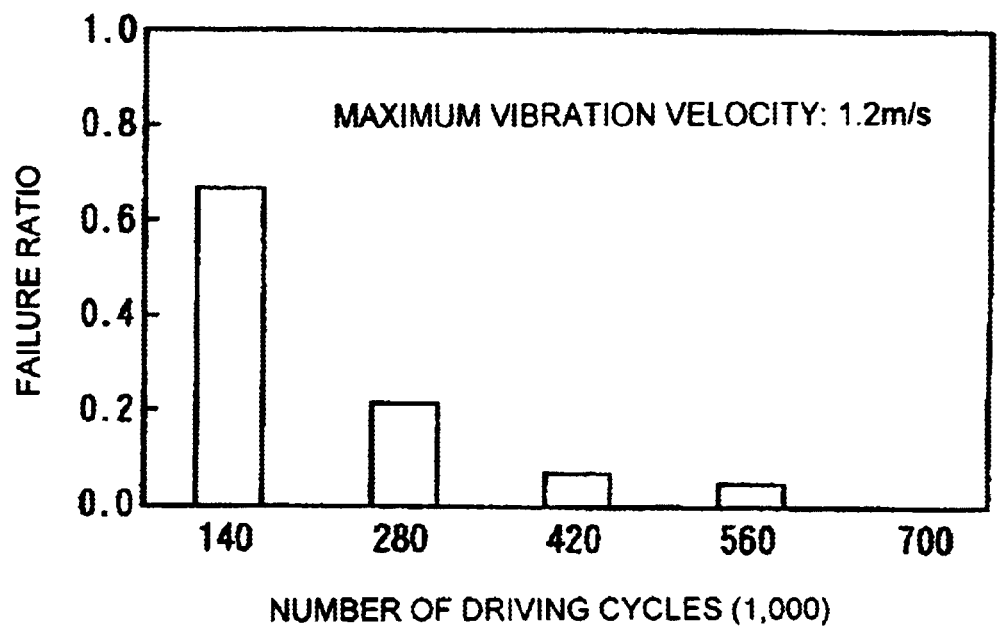
FIG. 3 is a graph showing a relationship between the number of driving cycles and failure ratio under vibration at a maximum vibration velocity of about 1.2 m/s.
Figure 4:
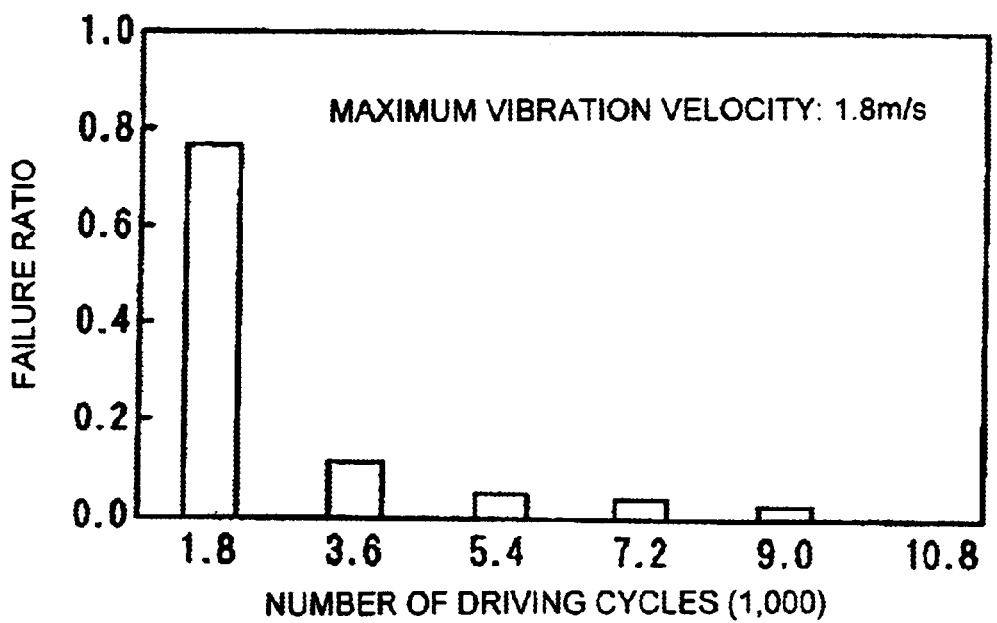
FIG. 4 is a graph showing a relationship between the number of driving cycles and failure ratio under vibration at the maximum vibration velocity of about 1.8 m/s.

FIGS. 3 and 4 are graphs showing a relationship between the number of driving cycles and the failure ratio of the piezoelectric transformer apparatus when the piezoelectric transformer apparatus is sinusoidally driven. In FIG. 3, the transformer apparatus is preferably driven so that the maximum vibration velocity is about 1.2 m/s.

In FIG. 4, the transformer apparatus is preferably driven so that the maximum vibration velocity is about 1.8 m/s. FIG. 3 shows that, when the maximum vibration velocity is about 1.2 m/s, at least 600,000 cycles are required until the apparatus failures settle. FIG. 4 indicates that, when the maximum vibration velocity is about 1.8 m/s, about 10,000 cycles are required until the apparatus failures settle. Thus, the number of transformer apparatus failures decreases exponentially. When the maximum vibration velocity is about 1.2 m/s, it is understood that about 600,000 cycles are required to damage all of the latent-defect apparatuses. When the maximum vibration velocity is about 1.8 m/s, it is understood that about. 10,000 cycles are required to damage all of the latent-defect apparatuses.

In general, the frequency of the piezoelectric transformer apparatus ranges from 50 kHz to 100 kHz. When the apparatus is driven at 50 kHz, 600,000 cycles at the maximum vibration velocity of about 1.2 m/s, this requires about 12 seconds, and 10,000 cycles at the maximum vibration velocity of about 1.8 m/s requires about 0.2 second. When the transformer apparatus is driven at 100 kHz, 600,000 cycles at the maximum vibration velocity of about 1.2 m/s, this requires about 0.2 second, and 10,000 cycles at the maximum vibration velocity of about 1.8 m/s requires about 0.1 second. When the screening method is applied to manufacturing processes, the time difference between driving at 10,000 cycles and the maximum velocity of about 1.2 m/s and driving at 10,000 cycles and the maximum velocity of about 1.8 m/s is substantially great. Taking into consideration the effects of heat generated by the piezoelectric transformer apparatus, which is described hereinafter, there is a difference of at least ten times the time required for the different screening methods described above. Therefore, it is preferable that the maximum vibration velocity is 1.8 m/s or greater in order that the screening process is completed within a screening time of a few seconds. The upper limit of the maximum vibration velocity is about 3.8 m/s, as described above. In view of the cost of the stress signal oscillator and the heat generated by the piezoelectric transformer apparatus, the maximum vibration velocity is selected so that there is enough time left for the manufacturing steps which are performed after the screening process (i.e. completing the manufacturing of the piezoelectric transformer apparatus).

Next, the load impedance connected to the generator is described.

Figure 5:
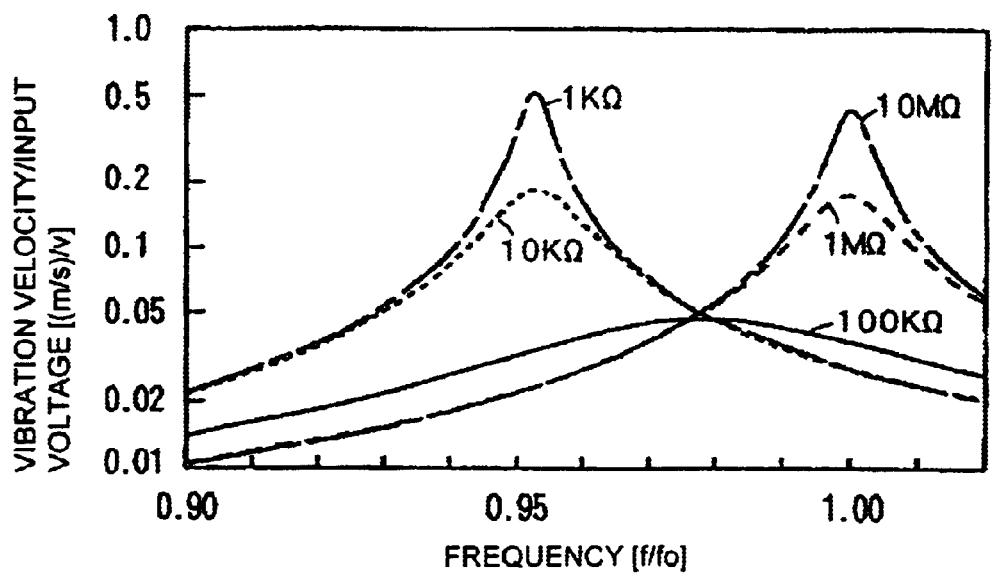
FIG. 5 is a graph showing frequency characteristics of vibration velocity when various load resistors are connected.

FIG. 5 is a graph showing frequency characteristics of the vibration velocity of the end surface of the transformer when various load resistors are connected. The frequencies (horizontal axis) are normalized by the frequency fo which reaches the maximum step-up ratio when the load is open. The vertical axis represents the vibration velocity per sinusoidal input voltage of 1 V 0-p (zero to peak).

Normally, the equivalent resistance of the cold-cathode tube ranges from about 50 kΩ to about 200 kΩ. For the highest efficiency, the output impedance of the piezoelectric transformer apparatus is set to a value that is close to the equivalent resistance of the cold-cathode tube. The output impedance of the piezoelectric transformer apparatus is a reciprocal of 2π×(generator capacitance)×(frequency).

With continued reference to FIG. 5, when the load resistance is about 100 kΩ, which is the closest to the load resistance in actual use, the maximum vibration velocity per 1 V 0-p input voltage is about 0.05 m/s. When the load resistance is not more than about 10 kΩ or not less than 1 MΩ, the maximum vibration velocity per 1 V 0-p input voltage is about 0.2 m/s or greater.

As described above, the upper limit of the maximum vibration velocity is about 3.8 m/s in preferred embodiments of the present invention. To obtain the maximum vibration velocity of 3.8 m/s with the load resistance of about 100 kΩ, it is necessary to apply an input voltage of 76 V 0-p. In consideration of the frequency dispersion of the piezoelectric transformer apparatus, it is necessary to apply an input voltage that is greater than this voltage. An expensive amplifier is required to generate such a high voltage, thus increasing the cost of the stress signal oscillator. Further, application of a high voltage fails to assure the safety of the screening process. On the contrary, when the load resistance is not more than about 10 kΩ or not less than about 1 MΩ, the voltage of the stress signal Is reduced to one quarter of the above voltage or smaller, thus resolving the above problem.

Accordingly, it is preferable that the load resistor connected to the generator is not more than about 10 kΩ or not less than about 1 MΩ in order to reduce the voltage of the stress signal and to obtain the required vibration level.

Next, heat generation caused by the piezoelectric transformer apparatus is described.

Since the piezoelectric transformer apparatus has a dielectric loss and a mechanical loss, heat is generated in accordance with mechanical vibrations caused by the stress signal. The generated heat limits the maximum vibration velocity of the piezoelectric transformer apparatus, thereby preventing it from achieving the required vibration level.

Figure 6:
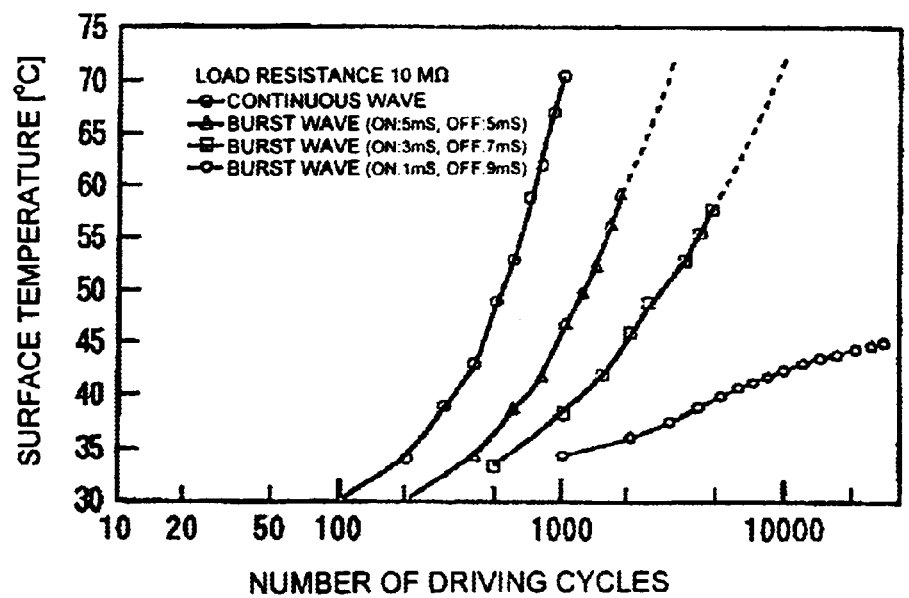
FIG. 6 is a graph showing a relationship between the number of driving cycles and temperature of the piezoelectric transformer apparatus when a duty ratio of a stress signal is changed.
Figure 7:
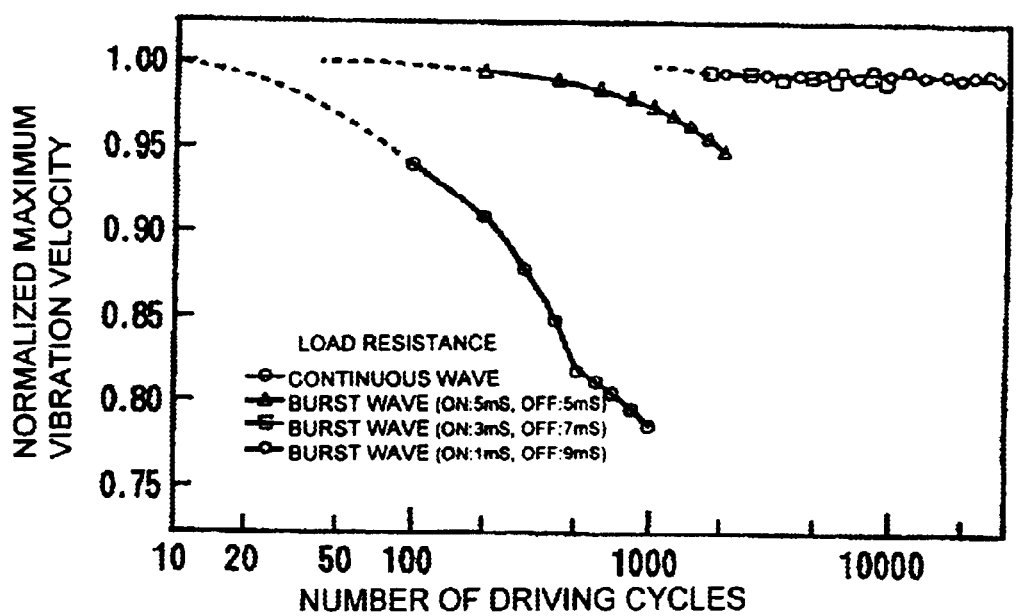
FIG. 7 is a graph showing a relationship between the number of driving cycles and the maximum vibration velocity when the duty ratio of the stress signal is changed.

FIG. 6 is a graph showing a relationship between the number of driving cycles and the temperature of the piezoelectric transformer apparatus. FIG. 7 is a graph illustrating a relationship between the number of driving cycles and the maximum vibration velocity. In both FIGS. 6 and 7, the piezoelectric transformer apparatus is initially driven at the maximum vibration velocity of about 1.8 m/s, with the load resistance of about 10 MΩ, using a continuous sinusoidal wave (a 100%-duty-ratio), a 50%-duty-ratio sinusoidal burst wave, a 30%-duty-ratio sinusoidal burst wave, and a 10%-duty-ratio sinusoidal burst wave. When the maximum vibration velocity is about 1.8 m/s, 10,000 cycles are required to perform the screening process, as described above. In FIG. 7, the maximum vibration velocity is normalized by the initial maximum vibration velocity of about 1.8 M/s.

FIG. 6 shows that the temperature of the piezoelectric transformer apparatus in each condition increases in accordance with the driving by the stress signal. When the duty ratio is about 30% or greater, the surface temperature of the apparatus is heated up to above about 70° C. by 10,000 cycles. It is thus impossible to manually handle the apparatus immediately after the screening process. When the duty ratio is about 10%, the surface temperature of the apparatus is about 45° C. or less, thus permitting safe handling of the apparatus immediately after the screening process.

FIG. 7 indicates that, when the duty ratio is about 30% and about 10%, the vibration velocity does not decrease after the apparatus is driven the required 10,000 cycles. However, when the duty ratio is about 50%, the vibration velocity decreases before the number of driving cycles reach the required 10,000 cycles, thereby failing to complete the proper screening process. This problem results from the heat generated by the transformer apparatus. Unless a cooling unit for cooling the piezoelectric transformer apparatus is provided, it is impossible to obtain a duty ratio of about 50% or greater.

In view of the effects of the heat caused by the driving of the stress signal, the duty ratio of the stress signal is preferably about 10% or less. Thus, the driving time of 10,000 cycles is about two seconds, permitting an efficient process.

The piezoelectric transformer apparatus is preferably driven via burst wave, so that the heat is dissipated when the stress signal is off, thereby controlling the temperature rise of the piezoelectric transformer apparatus as well as maintaining the required vibration level.

In order to suppress the temperature increase caused by the generated heat, the piezoelectric transformer apparatus may be cooled during the screening process, thus alleviating the effects of the generated heat. For example, a cooling fan may be provided for cooling the piezoelectric transformer apparatus. Another example may be a method in which a Peltier element is pasted on a jig on which the piezoelectric transformer apparatus is mounted, the Peltier element being electrified to absorb the heat.

The piezoelectric transformer element for which the screening method of the present invention is applied is not limited to the structure shown in FIG. 2. The piezoelectric transformer apparatus may be a single-plate Rosen-type piezoelectric transformer apparatus. In addition, the piezoelectric transformer apparatus is not limited to the Rosen-type transformer apparatus and may be other types of transformers.

While the invention has been particularly shown and described with reference to preferred embodiments thereof, it will be understood by those skilled in the art that the forgoing and other changes in form and details may be made therein without departing from the spirit of the invention.

What is claimed is:

1. A method for manufacturing and screening a piezoelectric transformer apparatus including a piezoelectric member having an actuator and a generator provided in the piezoelectric member, the method comprising the steps of:

beginning manufacturing of the piezoelectric transformer apparatus;

connecting a load impedance to said generator;

applying a stress signal to said actuator to vibrate the piezoelectric transformer apparatus;

identifying whether the transformer apparatus has a mechanical latent defect; and completing the manufacture of the piezoelectric transformer apparatus after the step of identifying whether the transformer apparatus has the mechanical latent defect; wherein the value of the load impedance is not less than about ten times an output impedance of the piezoelectric transformer apparatus.

2. The method according to claim 1, wherein a vibration level of the piezoelectric transformer apparatus caused by the stress signal is within a range of a vibration level of the piezoelectric transformer apparatus in actual use to a vibration level of a fatigue limit of a reference piezoelectric transformer apparatus.

3. The method according to claim 1, wherein the load impedance includes a resistance element.

4. The method according to claim 1, wherein the stress signal is a sinusoidal continuous wave.

5. The method according to claim 1, wherein the stress signal is a sinusoidal burst waves; and a duty ratio of the burst wave is not more than about 10%.

6. The method according to claim 1, wherein the piezoelectric transformer apparatus is cooled.

7. The method according to claim 1, wherein the piezoelectric transformer apparatus is a Rosen-type piezoelectric transformer apparatus.

8. The method according to claim 1, wherein the piezoelectric transformer apparatus includes a single piezoelectric plate.

9. The method according to claim 1, wherein the piezoelectric transformer apparatus includes multiple piezoelectric plates.

10. A method for manufacturing and screening a piezoelectric transformer apparatus including a piezoelectric member having an actuator and a generator provided in the piezoelectric member, the method comprising the steps of:

beginning manufacturing of the piezoelectric transformer apparatus;

connecting a load impedance to said generator;

applying a stress signal to said actuator to vibrate the piezoelectric transformer apparatus;

identifying whether the transformer apparatus has a mechanical latent defect; and completing the manufacture of the piezoelectric transformer apparatus after the step of identifying whether the transformer apparatus has the mechanical latent defect; wherein the value of the load impedance is not more than about one tenth of an output impedance of the piezoelectric transformer apparatus.

11. The method according to claim 10, wherein the stress signal is a sinusoidal burst wave; and a duty ratio of the burst wave is not more than about 10%.

12. The method according to claim 10, wherein a vibration level of the piezoelectric transformer apparatus caused by the stress signal is within a range of a vibration level of the piezoelectric transformer apparatus in actual use to a vibration level of a fatigue limit of a reference piezoelectric transformer apparatus.

13. The method according to claim 10, wherein the load impedance includes a resistance element.

14. The method according to claim 10, wherein the stress signal is a sinusoidal continuous wave.

15. The method according to claim 10, wherein the piezoelectric transformer apparatus is cooled.

16. The method according to claim 10, wherein the piezoelectric transformer apparatus is a Rosen-type piezoelectric transformer apparatus.

17. The method according to claim 10, wherein the piezoelectric transformer apparatus includes a single piezoelectric plate.

18. The method according to claim 10, wherein the piezoelectric transformer apparatus includes multiple piezoelectric plates.

* * * * *